(12) United States Patent
Tsai

(10) Patent No.: US 7,212,442 B2
(45) Date of Patent: May 1, 2007

(54) STRUCTURE FOR DIRECTLY BURNING PROGRAM INTO MOTHERBOARD

(75) Inventor: Ying-Chuan Tsai, Taipei (TW)

(73) Assignee: Inventec Corporation, Taipei (TW)

( * ) Notice: Subject to any disclaimer, the term of this patent is extended or adjusted under 35 U.S.C. 154(b) by 459 days.

(21) Appl. No.: 10/900,114

(22) Filed: Jul. 28, 2004

(65) Prior Publication Data

US 2006/0023560 A1  Feb. 2, 2006

(51) Int. Cl.
*G11C 11/34* (2006.01)
*G11C 16/06* (2006.01)

(52) U.S. Cl. .......................... 365/185.18; 365/185.22; 324/755; 713/2

(58) Field of Classification Search ...................... None
See application file for complete search history.

(56) References Cited

U.S. PATENT DOCUMENTS 6,472,895 B2 * 10/2002 Jaimsomporn et al. ..... 324/760
7,005,877 B2 * 2/2006 Tsai et al. .................... 324/765
7,135,878 B2 * 11/2006 Zhang ......................... 324/760
2006/0026462 A1 * 2/2006 Zhang et al. ................. 714/36

* cited by examiner

*Primary Examiner*—Huan Hoang
*Assistant Examiner*—Michael Weinberg
(74) *Attorney, Agent, or Firm*—Bacon & Thomas, PLLC

(57) ABSTRACT

The present invention relates to a structure for directly burning a program into a motherboard comprising a burning plate having a series connected first transistor set, a resistor, a comparator and a series connected second transistor set mounted thereon, wherein the first transistor set, the resistor, and comparator are series connected, two input terminals of the first transistor set and an output terminal of the comparator are electrically connected to a burner, an output terminal of the first transistor set is coupled to a serial data pin of a memory on the motherboard, an input terminal of the second transistor set is electrically connected to the burner, and an output terminal of the second transistor set is coupled to a serial clock pin of the memory for directly burning the program into the memory and checking the program burned therein.

7 Claims, 2 Drawing Sheets

STRUCTURE FOR DIRECTLY BURNING PROGRAM INTO MOTHERBOARD

BACKGROUND OF THE INVENTION

The present invention relates to a structure for directly burning program into a motherboard, more particularly to a structure utilizing a burner (e.g., personal computer) to directly burn a program into a memory (e.g., EEPROM) disposed on a motherboard and then check the program burned therein.

PRIOR ART OF THE INVENTION

The general method for burning a program into a memory (e.g., EEPROM) of an electronic apparatus (e.g., computer, server, etc) is shown in FIG. 1, wherein a burner (e.g., personal computer) is connected to the memory 11 for burning the program into the memory 11. After the program is burned, the memory 11 is welded on a motherboard of the electronic apparatus and is electrically connected to a controller 12 on the motherboard, enabling the controller 12 to perform related controlling and processing according to instructions (or data) and saved in the memory 11.

However, the occurrence of burning error (or disordered program) in the program burning operation of the burner will result in incompleteness of the burned program (or program error). Moreover, the prior art has the limited ability to check the burned program in the memory. It is always found that the burned program is wrong after the memory 11 is welded on the motherboard of the electronic apparatus. Thus, the memory 11 must be de-welded (de-mounted) from the motherboard of the electronic apparatus, and then the program is reburned. Thereafter, the memory is rewelded on the motherboard of the electronic apparatus. It wastes time and cost, and was very inconvenient.

SUMMARY OF THE INVENTION

Whereas the aforementioned program burning operation of the prior art resulted in deficiencies of waste of time and cost. The inventor has made sustained researches, experiments, and improvements to finally develop a structure for directly burning a program into a motherboard of the present invention in accordance with inventor's experience accumulated in the skill of manufacturing computers and servers to cure the deficiencies derived from the prior art.

One aspect of the present invention is to provide a structure for directly burning a program into a motherboard to enable a burner (e.g., personal computer) to directly burn the program into the memory (e.g., EEPROM) on the motherboard and to check the burned program after the program burning operation is completed.

According to the above aspect of the present invention, the structure comprises low resistance resistors (e.g., 100 ohm) coupled respectively to a power pin of a memory, e.g., EEPROM, on the motherboard, and connected the memory with a controller of the memory. The remaining pins of the memory except for the power pin, a serial clock pin (SCL), and a serial data pin (SDA) are connected to a ground (GND). The power pin of the memory is connected to a power (Vcc) to provide the memory with the required power in the program burning operation.

Moreover, the structure further comprises a burning plate, on which a series connected first transistor set, a resistor, a comparator, and a series connected second transistor set are mounted, wherein the first transistor set, the resistor, and comparator are series connected. Two input terminals of the first transistor set and an output terminal of the comparator are electrically connected to a burner, e.g., a personal computer, through a connection port. An output terminal of the first transistor set is coupled to the serial data pin of the memory. The input terminal of the second transistor set is electrically connected to the burner through the connection port. The output terminal of the second transistor set is coupled to the serial clock pin of the memory.

When the program is being burned into the memory, a burning status of the memory can be triggered by using the burner to transmit a burning signal level to the serial clock pin of the memory to enable the burner to burn the program into the memory; after the program is burned, a reading status of the memory can be triggered by using the burner to transmit a reading signal level to the serial clock pin of the memory to enable the burner to read and compare the program burned in the memory to accomplish the purpose of checking whether the burned program is correct or not.

The above and other objects, features and advantages of the present invention will become apparent from the following detailed description taken with the accompanying drawings.

DETAILED DESCRIPTION OF THE PREFERRED EMBODIMENT

Figure 1:
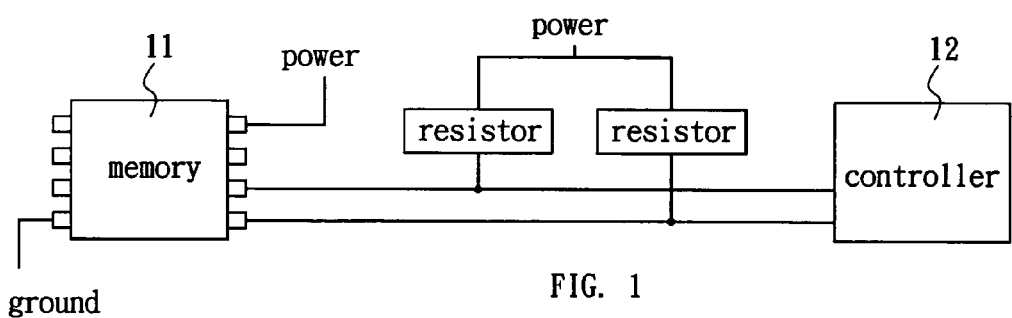
FIG. 1 is a block diagram showing a circuitry of the prior art.

The present invention discloses a structure for directly burning a program into a motherboard. Please refer to FIG. 2, the structure comprises a low resistance resistors 24 (e.g., 100 ohm) coupled respectively to a power pin 22 of a memory 21 on the motherboard, and a controller 23 connected with the memory 21 through a serial clock pin (SCL) 25, and a serial data pin (SDA) 26. The remaining pins (e.g., contacts A, B, C, D, and G shown in FIG. 2) of the memory 21 except for the power pin 22, the serial clock pin (SCL) 25 and the serial data pin (SDA) 26, the contact (e.g., contacts J and K shown in FIG. 2) between the resistors 24 and the controller 23, and the contact (e.g., contact E shown in FIG. 2) between a power of the memory 21 and the resistor 24 are connected to a ground (GND). The power pin 22 (e.g., contact F shown in FIG. 2) of the memory 21 is connected to the power (Vcc) to provide the memory 21 with the required power in the program burning operation.

Figure 2:
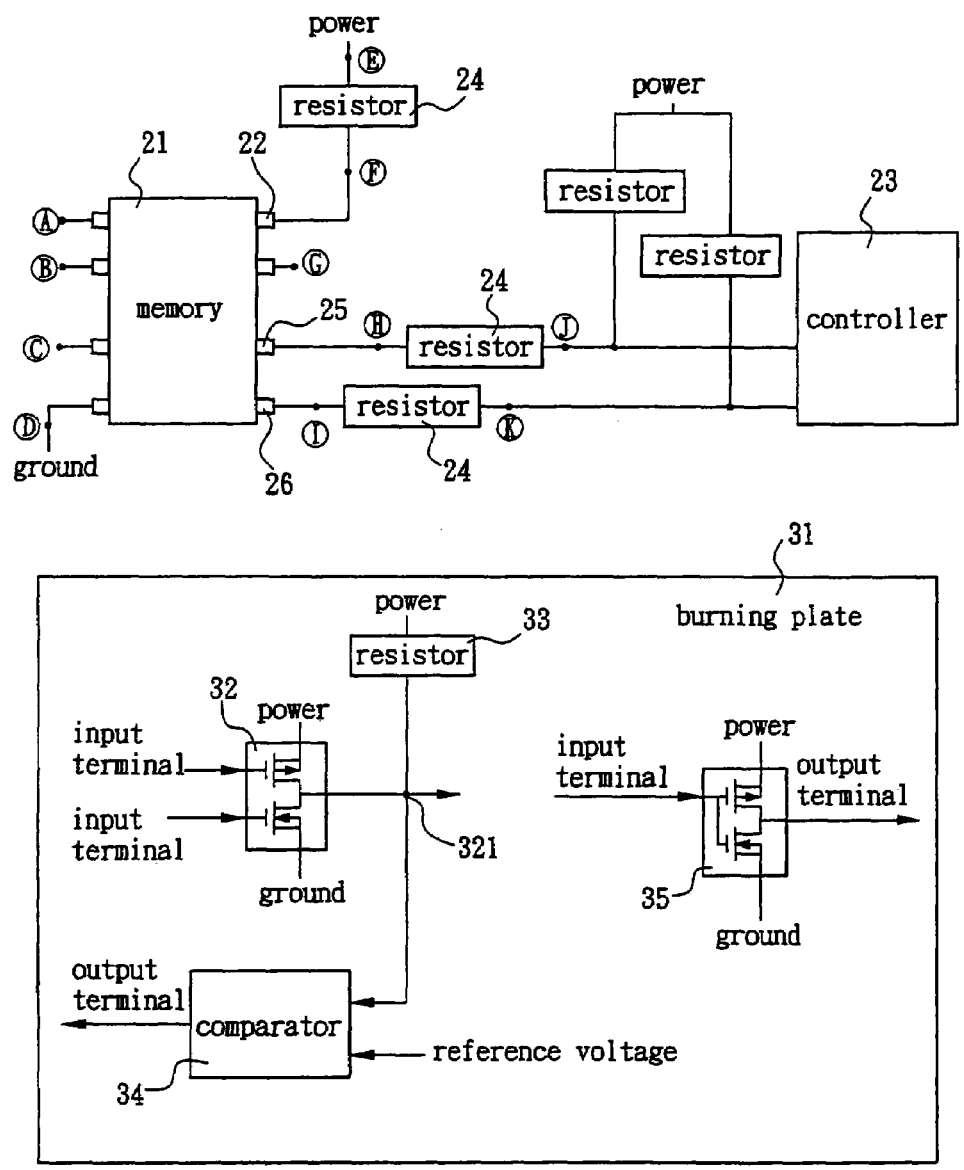
FIG. 2 is a block diagram showing a circuitry of the present invention.

Moreover, please refer to FIG. 2 again, the structure further comprises a burning plate 31, on which a series connected first transistor set 32, a low resistance resistor 33 (e.g., 200 ohm), a comparator 34, and a series connected second transistor set 35 are mounted. Wherein the first transistor set 32, the resistor 33, and comparator 34 are series connected. Two input terminals of the first transistor set 32 and an output terminal of the comparator 34 are electrically connected to a burner, such as a personal computer (not shown), through a connection port, such as RS-232 connection port (not shown). Thus, the burner is able to burn a program into the memory 21 through two input terminals of the first transistor set 32. The burner also can read potentials (low potential and high potential) of the burned program in the memory 21 through the output terminal of the comparator 34 to check the accuracy of these potentials. A reference voltage such as 0.8 volt is set on the comparator 34 that is therefore enabled to compare the output potentials (low potential and high potential) of the burned program through the reference voltage. An output terminal 321 of the first transistor set 32 is coupled to the serial data pin 26 of the memory 21, for example, the contact I as shown in FIG. 2, so that the burned program outputted from the memory 21 can be inputted into the comparator 34 via the serial data pin 26 and the output terminal 321 to perform a potential comparison. At the same time, the burner can burn the program into the memory 21 through the first transistor set 32, the output terminal 321, the serial data pin 26 of the memory 21. The input terminal of the second transistor set 35 is electrically connected to the burner through the connection port. The output terminal of the second transistor set 35 is coupled to the serial clock pin 25, for example, contact H as shown in FIG. 2, thereby enabling the burner to transmit a burning signal level (or a reading signal level) to the serial clock pin 25 of the memory 21.

Please refer to FIG. 2 again, by way of the combination of the above components, when the program is being burned into the memory 21 a burning status of the memory 21 can be triggered by using the burner to transmit the burning signal level (e.g., low potential) to the serial clock pin 25 of the memory 21 so as to enable the burner to burn the program into the memory 21. After the program is burned, a reading status of the memory 21 can be triggered by using the burner to transmit the reading signal level (e.g., high potential) to the serial clock pin 25 of the memory 21, and the first transistor set 32 is turned off to enable the burner to read and compare the program burned in the memory 21 to check whether the burned program is correct or not.

Please refer to FIG. 2 again, the serial data pin (SDA) 26 and the serial clock pin (SCL) 25 of the memory 21 are electrically connected to the controller 23, which is therefore enabled to perform the related control and processing according to instruction (or data) in the memory 21.

Please refer to FIG. 2 again, the output terminal 321 of the first transistor set 32 is coupled to the serial data pin 26 of the memory 21 (e.g., contact I as shown in FIG. 2) through a conductive wire (not shown) to accomplish the electrical connection.

Please refer to FIG. 2 again, the output terminal of the second transistor set 35 is coupled to the serial clock pin 25 of the memory 21 (e.g., contact H as shown in FIG. 2) through a conductive wire (not shown) to accomplish the electrical connection.

Please refer to FIG. 2 again, in the present invention, when the burner is burning the program into the memory 21, one transistor and the other transistor of the first transistor set 32 are respectively turned on and turned off unceasingly, so that the potentials (low level and high level) of burning program can be inputted into the memory 21 through these two transistors of the first transistor set 32 sequentially.

As described above, the present invention can directly burn the program into the memory 21 on the motherboard, and check the burned program after the program is burned. Thus, the deficiency of the prior art that the burned program cannot be checked is avoided. The convenience of the present invention is incomparable.

While the invention has been described by means of specific embodiments, numerous modifications and variations could be made thereto by those skilled in the art without departing from the scope and spirit of the invention set forth in the claims.

What the invention claimed is:

1. A structure for directly burning a program into a motherboard, comprising:

a plurality of low resistance resistors coupled respectively to a power pin of a memory on the motherboard, and connected between the memory and a controller of the memory, wherein remaining pins of the memory except for the power pin, a serial clock pin (SCL), and a serial data pin (SDA), a contact between a first resistor of the plurality of low resistance resistors and the controller, and a contact between a power of the memory and a second resistor of the plurality of low resistance resistors are connected to a ground (GND), the power pin of the memory coupled to the power to provide the memory with a required power in a program burning operation;

a burning plate, on which a series connected first transistor set, a third low resistance resistor, a comparator, and a series connected second transistor set are mounted, wherein the first transistor set, the third low resistance resistor, and comparator are connected to a common node, two input terminals of the first transistor set and an output terminal of the comparator are electrically connected to a burner through a connection port to enable the burner to burn the program into the memory through the two input terminals of the first transistor set and to read potentials (low potential and high potential) of the burned program in the memory through the output terminal of the comparator to check accuracy of these potentials, a reference voltage is set on the comparator which is enabled to compare the output potentials (low potential and high potential) of the burned program through the reference voltage, an output terminal of the first transistor set is coupled to the serial data pin through the common node of the memory so that the burned program outputted from the memory is inputted into the comparator through the serial data pin and the common node to perform a potential comparison, at the same time the burner burns the program into the memory through the first transistor set, the common node, and the serial data pin of the memory, the input terminal of the second transistor set is electrically connected to the burner through the connection port, and the output terminal of the second transistor set is coupled to the serial clock pin to enable the burner to transmit a burning signal level and a reading signal level to the serial clock pin of the memory;

wherein, when the program is being burned into the memory a burning status of the memory is triggered by using the burner to transmit the burning signal level to the serial clock pin of the memory to enable the burner to burn the program into the memory;

and wherein, after the program is burned, a reading status of the memory is triggered by using the burner to transmit the reading signal level to the serial clock pin of the memory, and the first transistor set is turned off to enable the burner to read and compare the program burned in the memory to check whether the burned program is correct or not.

2. The structure for directly burning the program into the motherboard of claim 1, wherein the serial data pin (SDA) and the serial clock pin (SCL) of the memory are electrically connected to the controller to enable the controller to perform related control and processing according to instruction and data on the memory.

3. The structure for directly burning the program into the motherboard of claim 1, wherein the output terminal of the first transistor set is coupled to the serial data pin of the memory through a conductive wire to accomplish an electrical connection.

4. The structure for directly burning the program into the motherboard of claim 1, wherein the output terminal of the second transistor set is coupled to the serial clock pin of the memory through a conductive wire to accomplish an electrical connection.

5. The structure for directly burning the program into the motherboard of claim 1, wherein the memory is an EEPROM.

6. The structure for directly burning the program into the motherboard of claim 1, wherein the connection port is a RS-232 connection port.

7. The structure for directly burning the program into the motherboard of claim 1, wherein the burner is a personal computer.

* * * * *